United States Patent
Lu et al.

(10) Patent No.: US 10,926,521 B2
(45) Date of Patent: Feb. 23, 2021

(54) METHOD AND SYSTEM FOR MASS ASSEMBLY OF THIN FILM MATERIALS

(71) Applicant: Palo Alto Research Center Incorporated, Palo Alto, CA (US)

(72) Inventors: JengPing Lu, Fremont, CA (US); Eugene M. Chow, Palo Alto, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 11 days.

(21) Appl. No.: 16/235,251

(22) Filed: Dec. 28, 2018

(65) Prior Publication Data
US 2020/0207068 A1  Jul. 2, 2020

(51) Int. Cl.
| B32B 37/00 | (2006.01) |
| B32B 37/10 | (2006.01) |
| B32B 38/04 | (2006.01) |
| B32B 38/18 | (2006.01) |
| H01L 21/677 | (2006.01) |

(52) U.S. Cl.
CPC ........ B32B 37/025 (2013.01); B32B 37/0046 (2013.01); B32B 37/10 (2013.01); B32B 38/04 (2013.01); B32B 38/1808 (2013.01); B32B 2457/14 (2013.01); H01L 21/67721 (2013.01)

(58) Field of Classification Search
CPC . H01L 2223/54433; H01L 2221/68368; H01L 29/1606; H01L 21/67144; H01L 23/544; H01L 2223/54473; H01L 21/67132; H01L 21/67721; H01L 21/6835; H01L 2223/54413; B32B 37/025; B32B 38/1808; B32B 38/04; B32B 37/10; B32B 2457/14; B32B 37/0046
See application file for complete search history.

(56) References Cited

U.S. PATENT DOCUMENTS

| 6,790,425 B1 | 9/2004 | Smalley et al. |
| 2010/0021708 A1* | 1/2010 | Kong ................ H01L 21/02527 428/220 |
| 2011/0278545 A1 | 11/2011 | Voutilainen et al. |
| 2011/0279014 A1 | 11/2011 | Winters et al. |

(Continued)

FOREIGN PATENT DOCUMENTS

| CN | 106876532 | 6/2017 |

OTHER PUBLICATIONS

EP Search Report from EP Application No. 19219907.3 dated May 14, 2020, 7 pages.

(Continued)

*Primary Examiner* — Vishal I Patel
(74) *Attorney, Agent, or Firm* — Mueting Raasch Group (57) ABSTRACT

Sheets of a thin film material are attached to a carrier wafer. The carrier wafer and the attached sheets of thin film material are separated to form chiplet carriers. Each chiplet carrier includes a portion of the sheets of thin film material attached to a portion of the carrier wafer. The chiplet carriers are placed on an assembly surface in a random pattern. The chiplet carriers are arranged from the random pattern to a predetermined pattern, and the portions of the thin film material are transferred from the chiplet carriers in parallel to a target substrate.

22 Claims, 7 Drawing Sheets

(56) References Cited

U.S. PATENT DOCUMENTS

2017/0200711 A1 7/2017 Uzoh et al.
2017/0278733 A1 9/2017 Chang et al.

OTHER PUBLICATIONS

Masubuchi et al., "Autonomous robotic searching and assembly of two-dimensional crystals to build van der Waals supertattices", Nature Communications 9:1413, 2018, pp. 1-12.
Novoselov et al., "2D materials and van der Waals heterostructures", Science, vol. 353, Issue 6298, Jul. 29, 2016, 13 pages.

* cited by examiner

METHOD AND SYSTEM FOR MASS ASSEMBLY OF THIN FILM MATERIALS

SUMMARY

The present disclosure is directed to a method and system for mass assembly of thin film materials. In one embodiment, sheets of a thin film material are attached to a carrier wafer. The carrier wafer and the attached sheets of thin film material are separated to form chiplet carriers. Each chiplet carrier includes a portion of the sheets of thin film material attached to a portion of the carrier wafer. The chiplet carriers are placed on an assembly surface in a random pattern. The chiplet carriers are arranged from the random pattern to a predetermined pattern, and the portions of the thin film material are transferred from the chiplet carriers in parallel to a target substrate.

In another embodiment, attaching sheets of thin film material to a carrier wafer that is separable to form a plurality of chiplets. The sheets of thin film material are optically mapped in relation to chiplets. The optical mapping determines an orientation of the portions of the sheets of thin film material relative to the chiplets. The carrier wafer and the attached sheets of thin film material are separated to form chiplet carriers having the portions of the sheets of thin film material attached the respective chiplets. The chiplet carriers are placed on an assembly surface in a random pattern and arranged to a predetermined pattern based on the optical mapping. Portions of the thin film material are transferred from the chiplet carriers in parallel to a target substrate. These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

The present disclosure relates to assembly of thin materials. Certain classes of materials, such as van der Waals materials (also referred to as 2-D materials), may formed as a sheet that can be as thin as one molecule in thickness. One well-known example of a van der Waals material is graphene, which is a single-molecule lattice of carbon atoms. Many van der Waals materials have uncommon properties (e.g., mechanical strength, low thermal and electrical resistance, etc.) and so there is interest in the development of devices that incorporate van der Waals materials. For purposes of this disclosure, the term 'thin film material' is used herein to describe any materials (including van der Waals materials) that are thin and delicate, such that the material is easily broken if conventional automated assembly processes are used. Such materials may have a thickness on the order of micrometers and sub-micrometers in some cases.

In order to mass-produce devices using thin film materials, automated systems are needed to, among other things, manufacture thin film material (e.g., via exfoliation or chemical layer deposition), divide the thin film material into individual units of the desired size, and move the units into a desired location and orientation, and then manipulate the units to form and assembly (e.g., stack thin film materials together and/or assemble with other components). Methods and apparatuses have been devised to separate the materials into individual units (referred to herein as 'chiplets') and move the chiplets into a desired location, e.g., a grid that allows the chiplets to be picked up for further processing.

Figure 1:
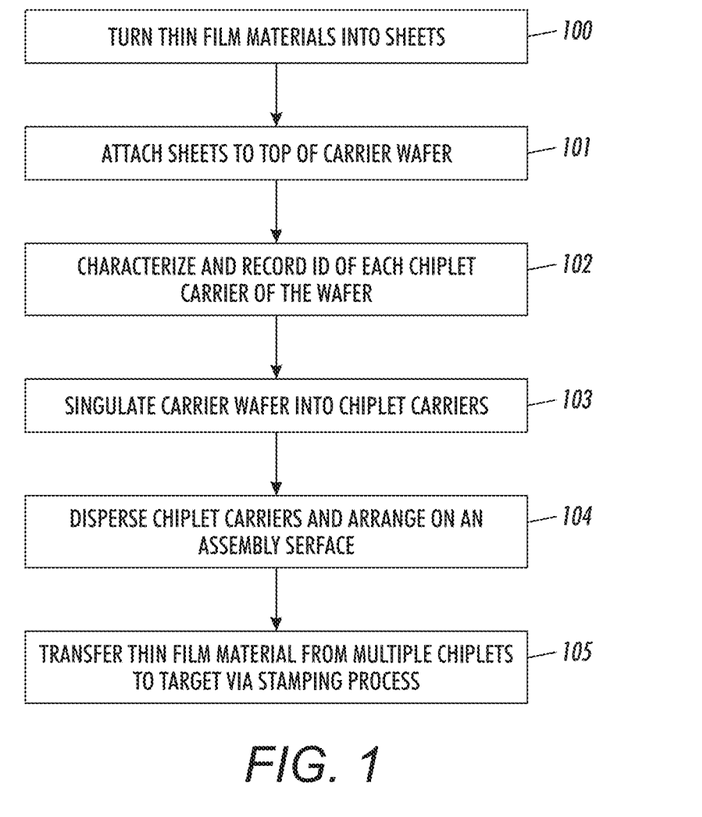
FIG. 1 is a flowchart of a method according to an example embodiment.

The present disclosure relates to methods and apparatuses used to facilitate massive parallel assembly of thin film materials. In FIG. 1, a flowchart outlines a chiplet assembly process according to an example embodiment. The van der Waal (2-D) materials are turned into 100 sheets, e.g., via mechanical or chemical exfoliation, chemical-vapor deposition, etc. The sheets are attached 101 to the top of a chiplet carrier wafer. The sheets may be of irregular sizes and shapes, and so are characterized and recorded 102 with the unique ID of each chiplet carrier that will be formed from the wafer. The chiplets will then be singulated 103 (e.g., divided into regular shapes) into individual chiplet carriers.

After singulation 103, the chiplet carriers are then dispersed 104 using a process compatible with thin film material and arranged into a pattern on an assembly surface. Examples dispersion processes are mechanical sonication or use of a solvent that does not damage the thin film material, and may be part of the singulation process 103. The chiplets carriers will be used as manipulation handler to arrange the thin film material to the desired pattern and orientations. The thin film material will then be transferred 105 to the final substrate via a stamping process, e.g., using a tacky transfer substrate that separates and picks up a large number of the thin film material portions from the chiplet carriers.

Figure 2:
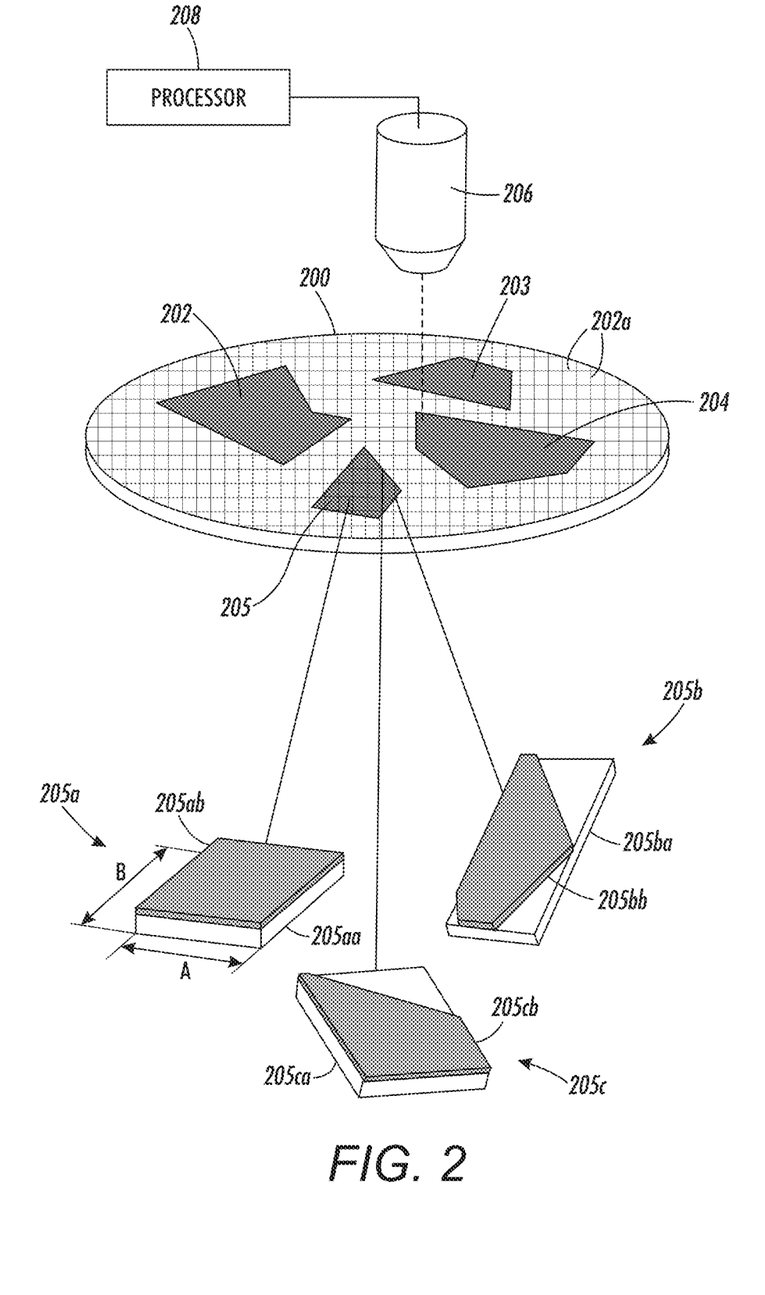
FIG. 2 is an isometric view showing thin film materials being characterized and separated according to an example embodiment.

In FIG. 2, an isometric view shows the assembly and characterization of sheets 202-205 of thin film material onto a carrier wafer 200 according to an example embodiment. The sheets 202-205, are placed on one surface of the carrier wafer 200, e.g., such that there is minimal or no overlap between the sheets 202-205. The sheets 202-205 may be floated onto the wafer 200 by a fluid layer. The carrier wafer 200 may be made from Si, having an $SiO_2$ coating on the top.

A sensor 206 (e.g., visible light imager, electron imager, infrared imager, ultraviolet imager, atomic force imager, photoluminescent imager, etc.) and processor 208 map the location of the sheets 202-205 relative to the wafer 200. The carrier wafer 200 will later be separated along the gridlines 202a, e.g., using a dicing tool such as scriber/cleaver, mechanical saw, laser saw, etcher/grinder, etc. The gridlines 202a may be pre-etched or otherwise marked on the wafer 202, or may be virtual, e.g., calculated by the processor 208 based on a predetermined singulation scheme. Note that other shapes besides a rectangular grid may be used to divide the carrier wafer 200 and sheets 202-205, e.g., hexagonal grid, diamond grid, etc. Further, the grid need not be uniform, e.g., may have different regions with different sized grids.

The wafer 202 and sheets 202-205 will be separated together, as indicated by the dashed lines over sheet 205. This will result in individual chiplet carriers 205a-205c, each having a rectangular base formed of a chiplet 205aa, 205ba, 205ca (which is a portion of the carrier wafer 200) that is partially or fully covered by thin film material 205ab, 205bb, and 205cb. The size of individual chiplets carriers 205a-205c (e.g., average of edge dimensions A and B) may be on the order of micrometers to millimeters, although may be smaller or larger in some embodiments.

The characterization of the sheets by the camera 206 and processor 208 can uniquely identify each of the chiplet carriers 205a-205c that are formed from this and other parts of the carrier wafer 200 and sheets 202-205. The processor 208 may give each chiplet carrier 205a-205c a unique identifier (ID) that can be used for subsequent operations. This unique identifier could be marked on the chiplet carriers 205a-205c, e.g., by laser engraving a barcode on a top or side of the carrier, or by standard photolithography and etching process.

Figure 3:
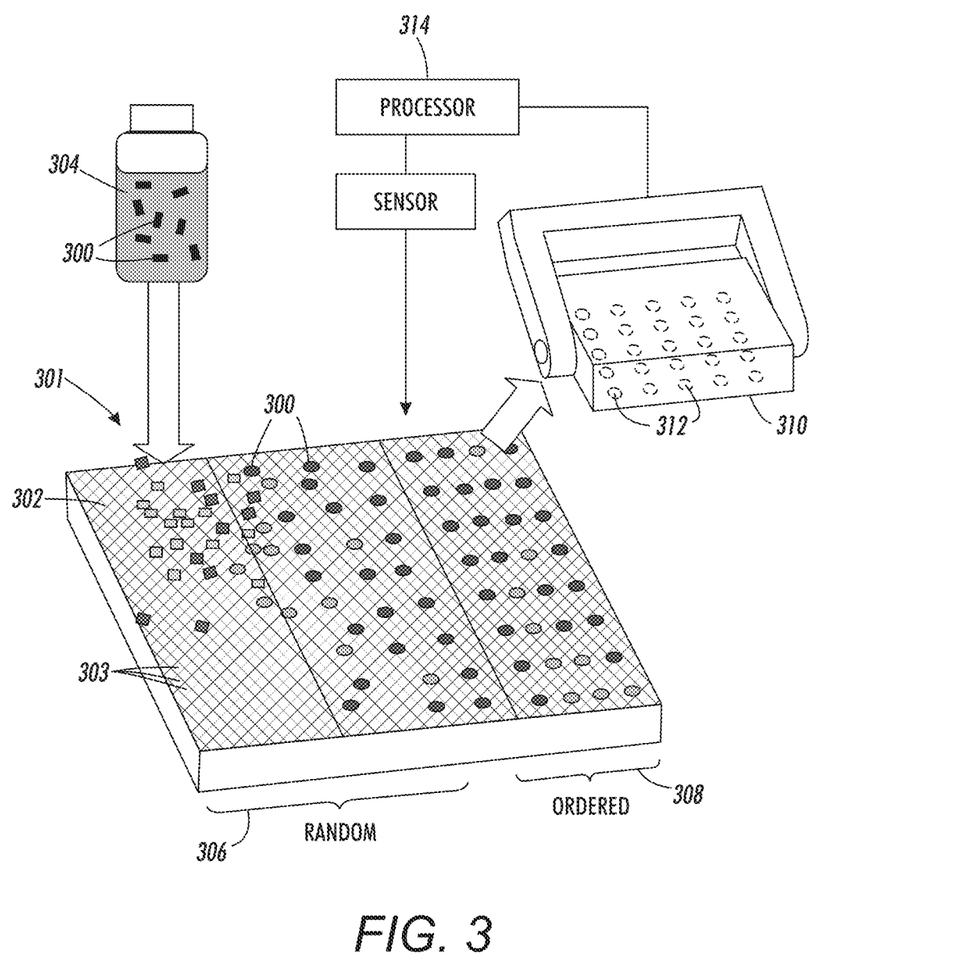
FIG. 3 is an isometric view of an assembly surface on which chiplet carriers are arranged and oriented according to an example embodiment.

As seen in FIG. 3, chiplet carriers 300 may be transported to an assembly surface 302, e.g., via a fluid carrier 304. On the assembly surface 302, the chiplet carriers 300 are selected, sorted, oriented and arranged. When first moved onto the assembly surface 302, the chiplet carriers are generally disordered, e.g., randomly arranged. The assembly surface 302 is part of a micro assembler 301 that utilizes actuators 303, e.g., electrodes, piezo actuators, magnets, etc., that cause the chiplet carriers 300 to be moved from a disordered (e.g., random) location and orientation at region 306 to ordered locations and orientations at region 308.

The actuators 303 (which may be located elsewhere besides the assembly surface 302) may use any combination of electrostatic forces, magnetic forces, acoustics waves, physical forces, fluidic actuation, etc., to move and orient the chiplet carriers 300 to the ordered locations. As indicated by processor 314 and sensor 316, the micro assembler 301 can automatically sense orientations of the chiplet carriers 300 and cause the actuators to gradually move the chiplet carriers 300 across the assembly surface 302 to the desired locations and orientations, e.g., as previously determined by processor 208 in FIG. 2. A description of various micro assembler embodiments can be found in U.S. Patent Publication US2002/0032US01 and U.S. patent application Ser. No. 16/221,803, filed Dec. 17, 2018, which are both hereby incorporated by reference.

Figure 4:
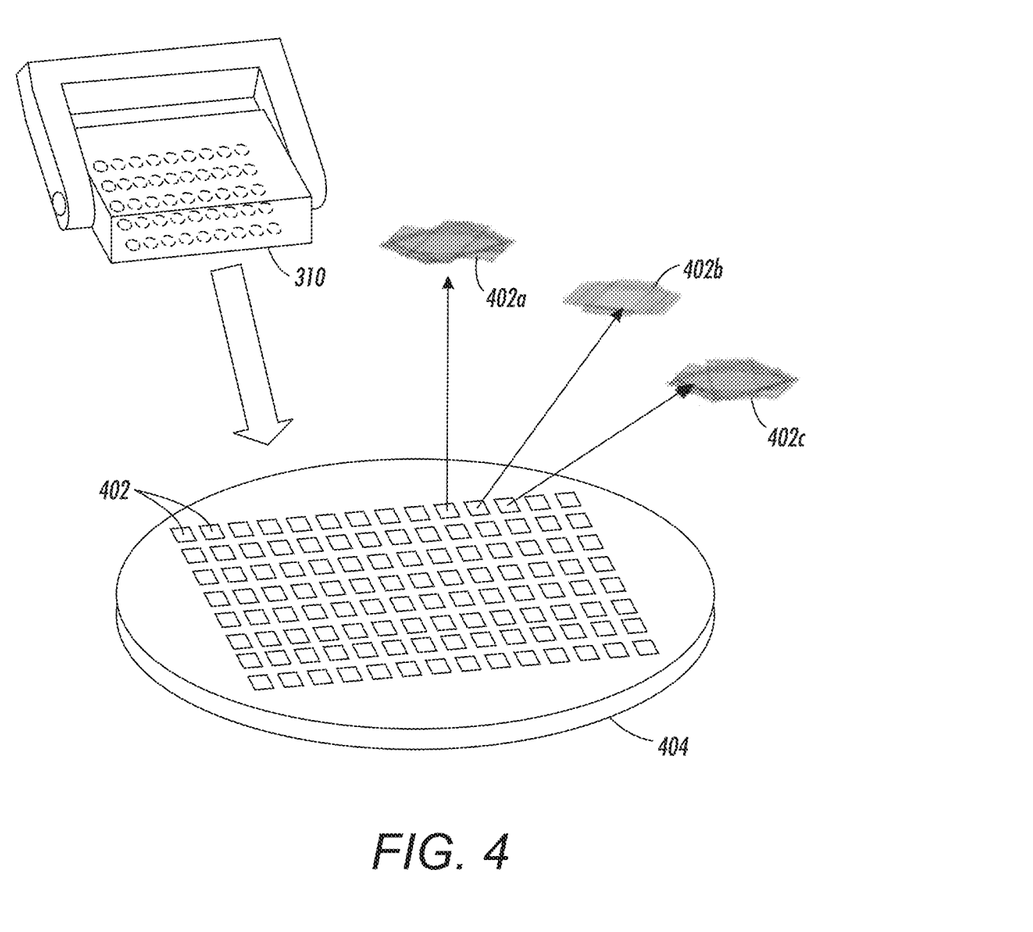
FIG. 4 is an isometric view of stacks of thin film material arranged on a target wafer according to an example embodiment.

The ordered locations in this example are a grid pattern that matches that of mildly adhesive protrusions 312 of a stamping head 310. As seen in FIG. 4, the stamping head 310 has picked up one or more stacks of thin film materials, which are then deposited individually or together to form stacks 402 on a target device wafer 404. Each of the stacks 402 may have differing orientations and/or compositions, as seen by close up views of stacks 402a-c.

Figure 5:
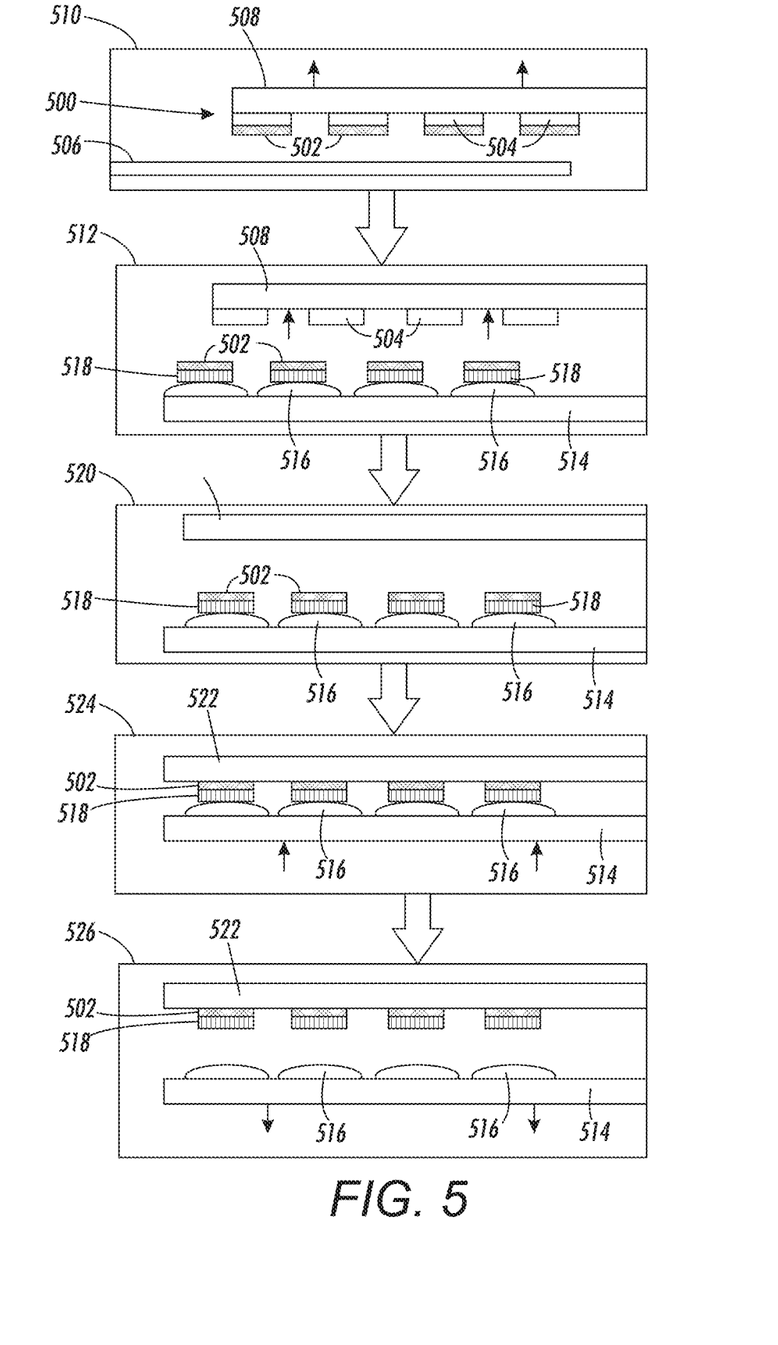
FIGS. 5 and 6 are diagrams of thin film material assembly procedures according to example embodiments and FIG. 7 is a flowchart of a method according to another example embodiment.

In FIG. 5, a diagram illustrates a sequence for forming a device using the chiplet carriers according to an example embodiment. A plurality of chiplet carriers 500 are each formed of a thin film material 502 on a chiplet 504. The chiplet carriers 500 were previously arranged on an assembly surface 506, e.g., as shown in FIG. 3. In this embodiment and as shown in block 510, a transfer arm 508 has a tacky surface that picks up the chiplet carriers 500 from the assembly surface 506. As seen in block 512, the chiplet carriers 500 have been brought into contact with a stamp head 514 that include hemispherical protrusions 516. Previously deposited portions of thin film material 518 are already assembled on the protrusions 518, and the transfer arm 508 presses the currently deposited thin film material 502 onto the previously deposited portions of thin film material 518. The protrusions 516 may be made of a viscoelastic, silicon-based, organic polymer such as polydimethylsiloxane (PDMS).

Generally, the steps shown in block 510 and 512 can be repeated for a number of steps. In one arrangement, when the newly added material 502 is moved over the protrusions 516, the ambient temperature may be elevated, e.g., around 45° C. After the material 502 contacts the protrusions 516 (or any intervening material 518), the temperature is rapidly cooled, e.g., to around 39° C. After cooling, the stamp head 514 will be separated from transfer arm using a smooth, swift motion.

As seen in block 520, the thin film material stacks 502, 518 are built on the array of protrusions 516. At this stage, the stacks 502, 518 are ready to be pressed into a target substrate 522 (e.g., intermediate or final substrate). Before being pressed together, stacks 502, 518 and substrates 514, 522 are the previous temperature from block 512, e.g., around 39° C. As seen in block 524, the stacks 502, 518 are pressed together with the target substrate 522. After the pressing together, the ambient temperature is increased, e.g., to around 135° C., to facilitate separating the stacks 502, 518 from the protrusions 516. As seen in block 526, the stamp head 514 is slowly removed, leaving the material stacks 502, 518 behind on the target substrate 522. The target substrate can then be further processed, e.g., depositing additional material layers, etching 502, 518 the stacks and additional materials, etc.

Figure 6:
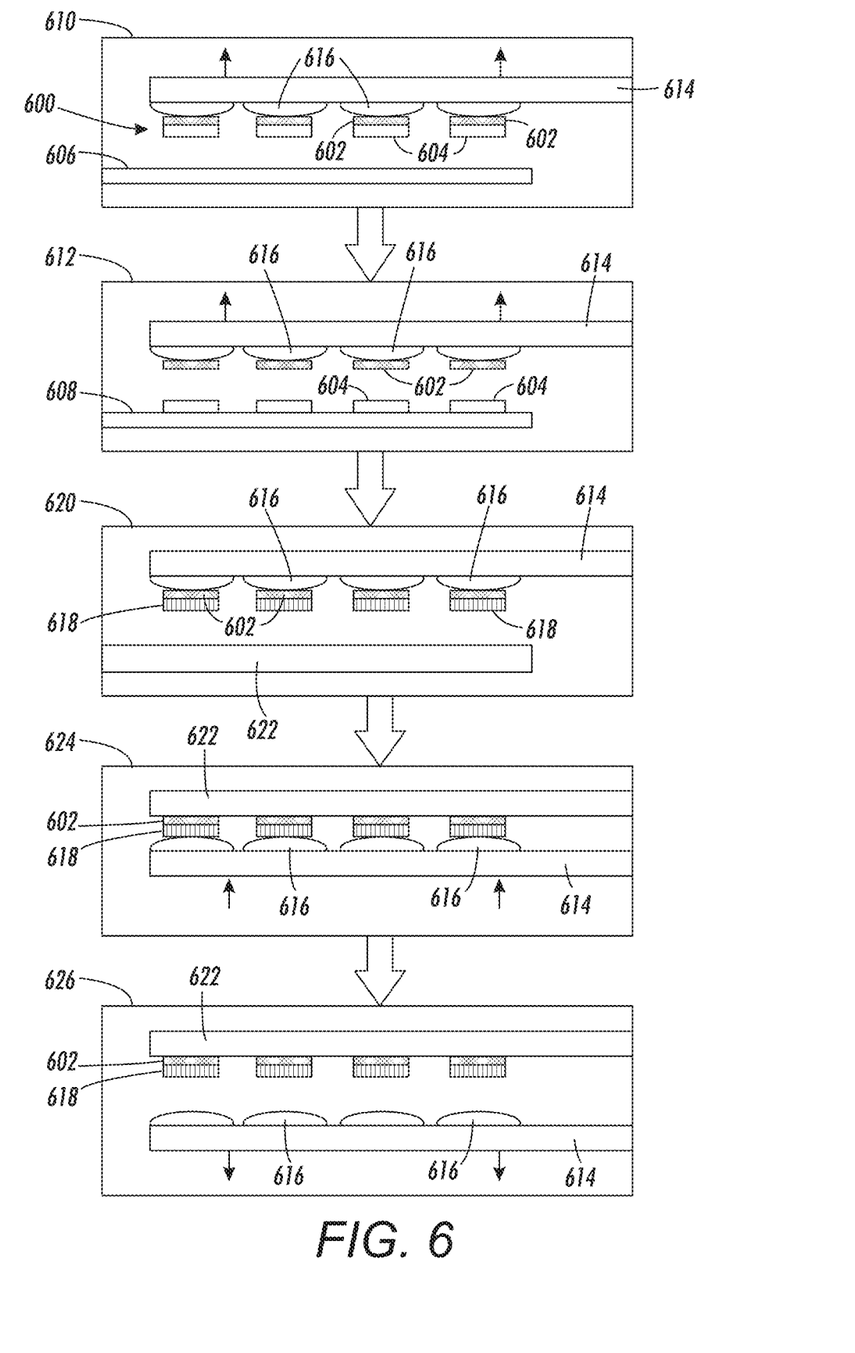

In FIG. 6, a diagram illustrates a sequence for forming a device using the chiplet carriers according to an example embodiment. A plurality of chiplet carriers 600 are formed on an assembly surface 606. Each chiplet carrier 600 includes a thin film material 602 on a chiplet 604. In this embodiment, a stamp head 614 that includes hemispherical protrusions 616 is brought into contact with the chiplet carriers 600 removing the chiplet carriers 600 from the assembly surface. As seen in block 612, the chiplets 604 are brought into contact with a tacky removal substrate 608 that facilitates removing the chiplets 604 from the thin film material 602, the latter remaining on the stamp head 614. The operations in block 612 may be performed at a somewhat low temperature, e.g., about 39° C., to help ensure the thin film material portions 602 do not separate from the protrusions 616.

The operations in blocks 610 and 612 can be repeated multiple times, resulting in a stack of thin film materials 602, 618 on the stamp head 614 as seen in block 620. At block 620 the stacks 602, 618 are ready to be pressed into a target substrate 622 (e.g., intermediate or final substrate). Before being pressed together, stacks 602, 618 and substrates 614, 622 may be at the previous temperature from block 612, e.g., 39° C. As seen in block 624, the stacks 602, 618 are pressed together with the target substrate 622. After the pressing together, the ambient temperature is increased, e.g., to 136° C., to facilitate separating the stacks 602, 618 from the protrusions 616. As seen in block 626, the stamp head 614 is slowly removed, leaving the material stacks 602, 618 behind on the target substrate 622. The target substrate can then be further processed, e.g., depositing additional material layers, etching 602, 618 the stacks and additional materials, etc.

The systems and methods above can facilitate high-throughput assembly of devices that utilize thin film materials. Large numbers (e.g., on the order of 1000's) of stacks/device can be assembled together. High throughput enables repeatable and consistent manufacturing. The methods and systems described herein can be used with other parallel assembly techniques, e.g., robotic pick and place, lithography, etc. Some processes may be modified, e.g., to use robotic pick-and-place machines on some aspects of the assembly. Using chiplet as a thin film material handler allows the specialized, sensitive 2-D process be detached from the other conventional chip assembly processes. The 2-D assembly processes described herein can be generalized beyond thin film material assembly. For example, small objects such as quantum dots, quantum wires, nano crystals, etc., can be carried with sacrificial chiplets and parallel-assembled in a similar manner as thin film materials.

Figure 7:
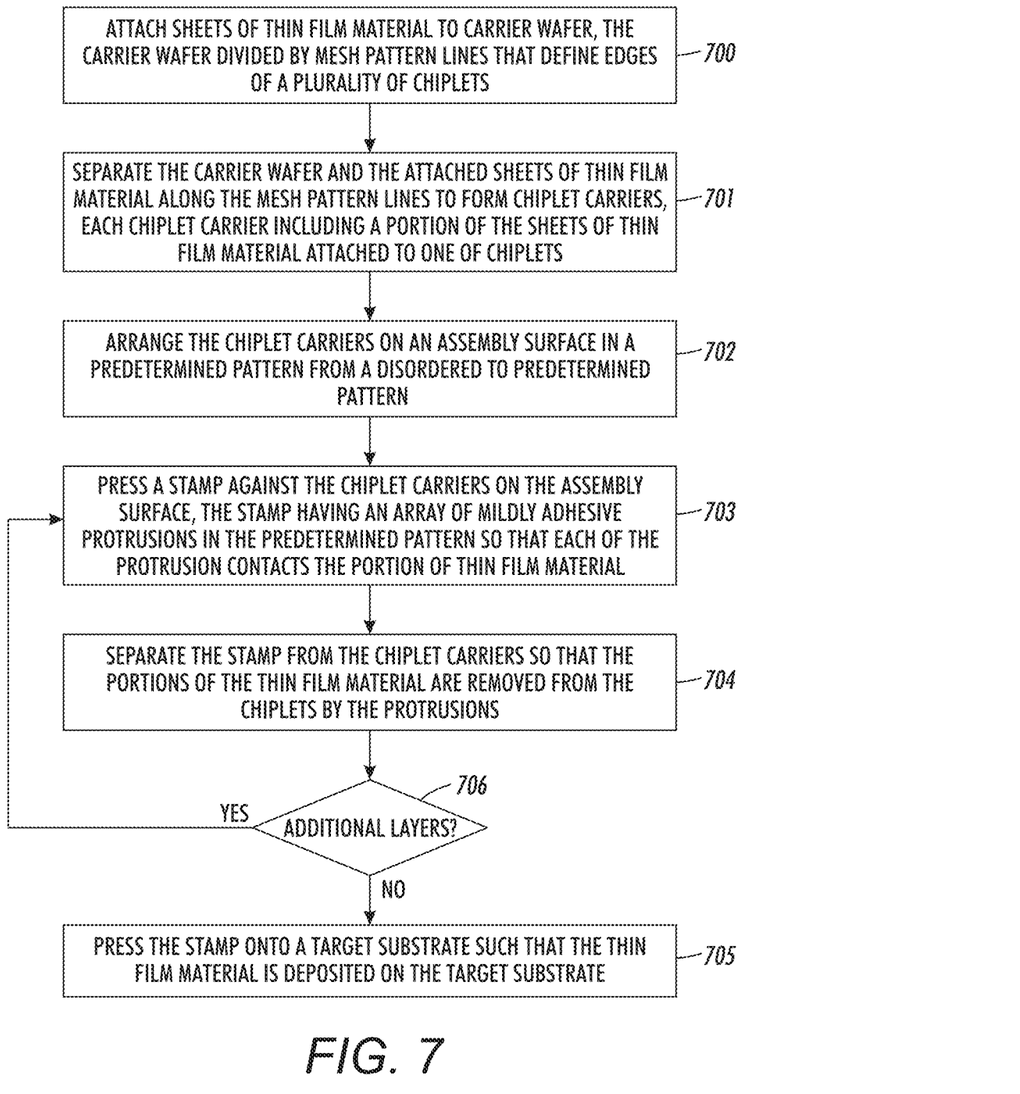

In FIG. 7, a flowchart shows a method according to an example embodiment. The method involves attaching 700 sheets of thin film material to a carrier wafer. The carrier wafer and the attached sheets of thin film material are separated 701 to form chiplet carriers. Each chiplet carrier includes a portion of the sheets of thin film material attached to a portion of the carrier wafer. The chiplet carriers are arranged 702 on an assembly surface from a disordered pattern to a predetermined pattern.

Operations 703-706 are an example of transferring the portions of the thin film material from the chiplet carriers in parallel to a target substrate. A stamp is pressed 703 against the chiplet carriers on the assembly surface. The stamp has an array of mildly adhesive protrusions in the predetermined pattern so that each of the protrusion contacts the portion of thin film material. The stamp is separated 704 from the chiplet carriers so that the portions of the thin film material are removed from the chiplets by the protrusions. As indicated by block 706, steps 703-704 can be optionally repeated for multiple layers of thin film material. After all layers are on the stamp, the stamp is pressed 705 onto a target substrate such that the thin film material is deposited on the target substrate.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method, comprising:
attaching sheets of thin film material to a carrier wafer;
separating the carrier wafer and the attached sheets of thin film material to form a plurality of chiplet carriers, each chiplet carrier comprising a portion of the sheets of thin film material attached to a portion of the carrier wafer;
placing the chiplet carriers on an assembly surface in a disordered pattern;
arranging the chiplet carriers from the disordered pattern to a predetermined pattern; and
transferring the portions of the thin film material from the chiplet carriers to a target substrate.

2. The method of claim 1, wherein the thin film material comprises a van der Waals material.

3. The method of claim 1, wherein transferring the portions of the thin film material from the chiplet carriers to a target substrate comprises:
pressing a stamp against the chiplet carriers on the assembly surface, the stamp comprising an array of mildly adhesive protrusions in the predetermined pattern so that each of the protrusion contacts the portion of thin film material;
separating the stamp from the chiplet carriers so that the portions of the thin film material are removed in parallel from the portions of the carrier wafer by the protrusions; and
pressing the stamp onto the target substrate such that the portions of the thin film material are deposited in parallel on the target substrate.

4. The method of claim 3, wherein the stamp is pressed against the chiplet carriers at an elevated temperature, and wherein the stamp and chiplet carriers are rapidly cooled before separating the stamp from the chiplet carriers.

5. The method of claim 3, wherein portions of a second thin film material are on each of the protrusions before pressing the stamp against the chiplet carriers, and wherein pressing the stamp against the chiplet carriers causes the protrusions to contact the portion of thin film material via the second thin film material, thereby causing the portion of the thin film material and the second thin film material to form a material stack.

6. The method of claim 5, wherein pressing the stamp onto the target substrate causes the material stack to be deposited on the target substrate.

7. The method of claim 1, further comprising utilizing a sensor and processor to map the sheets of thin film material in relation to the portions of the carrier wafer before separating the carrier wafer to form the chiplet carriers, the mapping used to select the chiplet carriers to be arranged in the predetermined pattern.

8. The method of claim 7, wherein the mapping is further used to define an orientation of each of the chiplets in the predetermined pattern.

9. The method of claim 7, further comprising assigning each of the chiplet characters a unique identifier that is associated with characteristics determined from the mapping.

10. The method of claim 9, wherein the unique identifiers and mapping are used to arrange the chiplet carriers from the disordered pattern to the predetermined pattern.

11. The method of claim 1, further comprising marking a unique identifier on each of the chiplets, the unique identifiers being used in arranging the chiplet carriers from the disordered pattern to the predetermined pattern.

12. The method of claim 1, wherein the chiplet carriers comprise edge dimensions on the order of millimeters to micrometers.

13. The method of claim 1, wherein arranging the chiplet carriers from the disordered pattern to the predetermined pattern comprises using electrostatic actuation.

14. A method, comprising:
attaching sheets of thin film material to a carrier wafer, the carrier wafer separable to form a plurality of chiplets;

mapping the sheets of thin film material in relation to chiplets via a sensor and a processor, the mapping determining an orientation of the portions of the sheets of thin film material relative to the chiplets;

separating the carrier wafer and the attached sheets of thin film material to form chiplet carriers comprising the portions of the sheets of thin film material attached to the respective chiplets;

placing the chiplet carriers on an assembly surface in a disordered pattern;

arranging the chiplet carriers from the disordered pattern to a predetermined pattern based on the mapping; and transferring the portions of the thin film material from the chiplet carriers to a target substrate.

15. The method of claim 14, wherein unique identifiers and mapping are used to arrange the chiplet carriers from the disordered pattern to the predetermined pattern.

16. The method of claim 14, wherein the thin film material comprises a van der Waals material.

17. The method of claim 14, wherein the assembly surface comprises a micro assembler with a plurality of actuators that arrange the chiplet carriers from the disordered pattern to the predetermined pattern.

18. The method of claim 17, wherein a processor is coupled to the micro assembler and operable to move the chiplet carriers across the assembly surface to desired locations within the predetermined pattern.

19. The method of claim 17, wherein the actuators comprise electrodes.

20. The method of claim 1, wherein the assembly surface comprises a micro assembler with a plurality of actuators that arrange the chiplet carriers from the disordered pattern to the predetermined pattern.

21. The method of claim 20, wherein a processor is coupled to the micro assembler and operable to move the chiplet carriers across the assembly surface to desired locations within the predetermined pattern.

22. The method of claim 20, wherein the actuators comprise electrodes.

* * * * *